United States Patent [19]

Hofmann

[11] Patent Number: 5,657,350
[45] Date of Patent: Aug. 12, 1997

[54] AUDIO CODER/DECODER WITH RECURSIVE DETERMINATION OF PREDICTION COEFFICIENTS BASED ON REFLECTION COEFFICIENTS DERIVED FROM CORRELATION COEFFICIENTS

[75] Inventor: Rudolf Hofmann, Forchheim, Germany

[73] Assignee: U.S. Philips Corporation, New York, N.Y.

[21] Appl. No.: 362,513

[22] PCT Filed: May 2, 1994

[86] PCT No.: PCT/IB94/00007

§ 371 Date: Jan. 5, 1995

§ 102(e) Date: Jan. 5, 1995

[87] PCT Pub. No.: WO94/25961

PCT Pub. Date: Nov. 10, 1994

[30] Foreign Application Priority Data

May 5, 1993 [DE] Germany .................. 43 14 921.9

[51] Int. Cl.$^6$ .................. G01L 9/14; H03H 17/00
[52] U.S. Cl. .................. 375/241; 375/242; 348/409; 395/2.28; 395/2.09
[58] Field of Search .................. 375/232, 241, 375/242–245, 253–254; 381/30, 35; 364/724.04, 724.19; 348/404–405, 409, 410, 419; 395/2.28, 2.38, 2.39

[56] References Cited

U.S. PATENT DOCUMENTS

| 4,509,150 | 4/1985 | Davis | 375/249 X |
| 4,520,491 | 5/1985 | Raulin et al. | 375/245 |
| 4,831,636 | 5/1989 | Taniguchi et al. | 375/245 |
| 4,872,132 | 10/1989 | Retter | 364/748 |
| 5,025,404 | 6/1991 | Janssen et al. | 364/723 |
| 5,142,656 | 8/1992 | Fielder et al. | 395/2.38 |

OTHER PUBLICATIONS

Juin–Hwey Chen, "High–Quality 16 KB/S Speech Coding With a One–Way Delay Less Than 2 MS", pp. 453–456, 1990 IEEE S9.1.

L.R. Rabiner/R.W. Schafer, "Levinson–Durban Recursion" in the Textbook Digital Processin Go Fspeech Signals, Prentice Hall Signal Processing Series, pp. 396–421.

CCITT Recommendation G. 728, "Coding of Speech Signals at 16 K Bits/S".

Primary Examiner—Young T. Tse
Attorney, Agent, or Firm—Leroy Eason

[57] ABSTRACT

A coder/decoder for samples of speech or other audio signals with bit rate reduction includes an adaptive prediction filter having filter coefficients which are recursively computed according to the known Levinson-Durbin Recursion. Such computation is based on reflection coefficients derived from correlation coefficients applicable to segments of the audio signal samples, the reflection and prediction coefficients being in N-bit fixed point arithmetic. A $k^{th}$ reflection coefficient after its first computation is buffered with a minimum accuracy of N+1 bits, and the k–1 previously computed prediction coefficients are recomputed with a limitation of N bits. If overflow occurs, the buffered value is divided, e.g. by 2, after the re-computation is completed and then rounded to N bits. Since rounding occurs only after the new prediction coefficients are derived, the recursion achieves reduced error and is simpler to calculate.

6 Claims, 3 Drawing Sheets

AUDIO CODER/DECODER WITH RECURSIVE DETERMINATION OF PREDICTION COEFFICIENTS BASED ON REFLECTION COEFFICIENTS DERIVED FROM CORRELATION COEFFICIENTS

RELATED APPLICATION

This application is related to concurrently filed co-pending application Ser. No. 08/362,515, filed on Jan. 5, 1995, of the same inventor, now still pending.

The related application relates to a linear predictive coder or decoder wherein the number of recursive recomputations which must be repeated when an overflow occurs is minimized by only performing such repeated recomputation starting with the prediction coefficient at which overflow occurs. That is feasible because the values of the previously recomputed coefficients will correspond to the values that would be obtained if they were again recomputed using a revised block floating point format. The present Application relates to a predictive coder or decoder wherein recursive recomputations of prediction coefficients is performed more accurately but without increasing the complexity of the required calculations.

BACKGROUND OF THE INVENTION

1. Field of the Invention

The invention relates to a transmission system comprising a coder for coding a signal, and a transmitter for transmitting the coded signal to a receiver, which includes a decoder for decoding the coded signal, and an adaptive prediction filter.

The invention likewise relates to a terminal unit, a coder, a decoder and an adaptive prediction filter.

2. Description of the Related Art

Such a transmission system can be obtained, for example, without difficulty from the document "Draft text for Annex A 16 k/bits of G.728 Fixel Point Specification" Temporary Document 41(P), CCIT Study Group 15, Geneva, Sept. 7–17, 1993, which corresponds to no longer available Doc. AH. 93-D.3, CCITT Study Group XV, London, Mar. 29–30, 1993, and from CCITT Recommendation G.728, "Coding of speech signals at 16 kbit/s using low-delay code excited linear prediction," Geneva, 1992. The first two documents will henceforth be referenced [I] and [II]. Such transmission systems can be used to provide multiple use of a given transmission capacity. The reduction of the bit rate of a signal 64 coding makes it possible, for example, to hold four 16 k/bits telephone conversations simultaneously over one 64 kbit/s transmission channel.

The multiple use of a given transmission capacity has very much importance in radio channels, as will be readily understood if one considers of the rising number of subscribers of mobile radio systems. Also the storage capacity of a memory with an arbitrary storage medium can be used to considerably more advantage when bit rate reducing coders and appropriate decoders are used, because less storage space is necessary for storing an information signal.

It is known to utilize linear prediction for bit rate reduction. In [I] and [II] prediction coefficients are computed by an adaptive prediction filter. The computation is performed segment by segment using sample values of an auxiliary signal which may be an (electric) audio signal or speech signal, for example, coming from a person. Alternatively, it is possible for the auxiliary signal to be a synthetic audio or speech signal as produced in a coder which operates according to the principle of "analysis by synthesis". A linear correlation between a predicted sampling value (prediction value) of the auxiliary signal and previous sampling values of this signal is realised with the prediction coefficients. The prediction coefficients are determined so that the sum of the squares of all the errors computed for a segment of sampling values assumes a minimum value. An error is here meant to be understood as the difference between a sampling value and its predicted value. More accurate descriptions will be given hereinbelow.

In [I] and [II] an excited signal is converted into a synthetic audio signal by a synthesis filter. This synthetic audio signal is subtracted from an audio signal to be coded and the difference is used for optimizing the selection of the excited signal.

The computation of the prediction coefficients calls for correlation coefficients which are derived from the sampling values of the synthetic audio signal. The computation of the prediction coefficients on the basis of the correlation coefficients calls for much circuitry and cost. To reduce this circuitry and cost the prediction coefficients are computed recursively. To begin with, a first reflection coefficient is computed from the two first correlation coefficients. From the first reflection coefficient the first prediction coefficient is derived. Furthermore, also a prediction error is computed, which is an indication of the quality of the prediction. Then, a second reflection coefficient is computer from the next correlation coefficient, the previously computed prediction coefficient and the current prediction error. With the second reflection coefficient and the previously computed prediction coefficients (at this point only the first prediction coefficient is concerned) the previously computed prediction coefficients are recomputed. Then, a second prediction coefficient and a new prediction error are computed. The recomputation of the previously computed prediction coefficients and the computation of a further prediction coefficient is repeated as many times as necessary to derive all the necessary prediction coefficients.

In [II] an implementation in floating point arithmetic is proposed for obtaining sufficient accuracy. The drawback of an implementation in floating point arithmetic is the extensive circuitry. For this reason, in [I] there is proposed to implement 16-bit fixed point arithmetic in which results and intermediate results of the computation are retained in the so-called block floating point format. This is meant to be understood as the representation of a 6lock of numbers in floating point format, with the restriction, however, that all the numbers of the block have the same exponent (with base 2). The common exponent is selected such that all the mantissas are situated within prescribed limits. In [I] there is provided that all the mantissas are situated between −1 and +1. In the block floating point format, for example, the prediction coefficients are shown which, from previous experience, assume values that may be on the order of 10. If, for example, overflow occurs when the prediction coefficients are recomputed i.e. a recomputed prediction coefficient will be 1 or exceed 1, the mantissas of all the previously computed prediction coefficients will be divided by 2 and the common exponent (with base 2) will be increased by 1. Then the recomputation is started anew. The change of the block floating point format due to overflow will here be called an adaptation of the block floating point format. For the repeated recomputation only the mantissas of the previously computed prediction coefficients are used, and only with 16-bit resolution. The reduction of the resolution from at least 17 bits to 16 bits which is sometimes necessary for the computation can be effected in different manners. The manner of reduction according to [I] will be outlined with the aid of an example. If, for example, the third reflection coefficient has just been computed with a resolution of 17 bits—between the third reflection coefficient and the third prediction coefficient to be derived therefrom there is only a difference in the numerical representation—it is shortened by a rounding to 16 bits, so that the two first prediction coefficients can be recomputed therewith in 16-bit fixed point arithmetic. If there is an overflow during this recomputation, also the rounded third reflection coefficient is, for example, divided by two when recomputation has ended, and the result which has a resolution of 16 bits is stored as a mantissa of the third prediction coefficient. The division is broken off after 16 bits (including the sign bit). Due to the binary system this operation corresponds to a shift of the decimal point by one position while the least-significant bit is lost. This procedure causes the inaccuracies—especially with a large number of prediction coefficients—to become unacceptably large.

SUMMARY OF THE INVENTION

It is an object of the invention to enhance the computational accuracy of coding in a transmission system of the type defined in the opening paragraph, without increasing the computation effort. A transmission system having this property comprises a coder for coding a sampled audio signal, a transmitter for transmitting the coded signal to a receiver, a decoder at the receiver for decoding the received coded signal, and an adaptive prediction filter provided at the coder, the adaptive prediction filter including:

first processing means for computing correlation coefficients from segments of sampling values of an auxiliary signal that corresponds to the audio signal or the decoded signal, as well as second processing means for determining reflection and prediction coefficients from the correlation coefficients in N-bit fixed point arithmetic. third processing means which, in cooperation with the second processing means, performs the following steps for recursively determining the prediction coefficients to be represented in the block floating point format:

a) determining the $k^{th}$ reflection coefficient with a minimum resolution of N+1 bits, b) buffering the $k^{th}$ reflection coefficient obtained in a), c) determining the $k^{th}$ reflection coefficient with a resolution of N bits, d) recomputing the k–1 previously computed prediction coefficients while utilizing the $k^{th}$ reflection coefficient obtained under c), e) adapting the block floating point format of the k–1 prediction coefficients if during the recomputation of the k–1 previously computed prediction coefficients overflow occurs, so that N bits are no longer sufficient to represent a recomputed prediction coefficient, f) converting the $k^{th}$ reflection coefficient buffered under b) to a number in the floating point format, whose exponent is represented by the exponent determined under e) of the block floating point format and whose mantissa has a resolution of at least N+1 bits, g) rounding to N bits the mantissa of the $k^{th}$ reflection coefficient obtained under f) and h) storing the $k^{th}$ reflection coefficient obtained under g) as the $k^{th}$ prediction coefficient.

The transmission system according to the invention is distinguished from a transmission system described in [I] in that the $k^{th}$ reflection coefficient after its first computation is buffered with a minimum accuracy of N+1 bits. For the recomputation of the k–1 previously computed prediction coefficients a value is used which distinguishes itself from the buffered value by a limitation to N bits. If overflow occurs during the recomputation of the k–1 previously computed prediction coefficients, the buffered value is divided, for example, by 2 after the recomputation has finished, and then rounded to N bits. This way of incorporating the $k^{th}$ prediction coefficient in the (adapted) block floating point format produces an error which is at most as large as the corresponding error in [I]. However, it is equally important that the sign of the error according to the invention turns out to be as often positive as negative, which is different from [I].

These assertions will now be explained with the aid of two simple examples.

Let us assume that three (N=3) bits are available for representing the final results and at least four bits for intermediate results. Furthermore, let us assume that the adaptation due to overflow requires a division by 4. Numerical examples for $k^{th}$ reflection coefficients having a 4-bits resolution in fixed point representation are started from.

In a first example a $k^{th}$ reflection coefficient has a value of +⅝. In the binary system this reflection coefficient is represented as 0.101, the first zero denoting the sign. According to [I] the procedure is as follows:

a) 0.101 ($k^{th}$ reflection coefficient: +⅝ with 4-bits resolution)

b) 0.11 (value of a) rounded to 3 positions for the recomputation of the k–1 previously computed prediction coefficients)

c) 0.00 (value of b) divided by 4, also with 3-bits resolution. This value is the mantissa of the $k^{th}$ reflection coefficient in the block floating point format with the exponent 2 and with base 2)

For making an assertion about the error if the approximation c) is used in lieu of a), c) is first to be multiplied again by 4. The difference between the value resulting therefrom and the output value is the error F. In the present case (representation as a fraction) F=(−⅝)=−⅝. In contrast, according to the invention there is provided:

a) 0.101 ($k^{th}$ reflection coefficient: +⅝ with 4-bits resolution), b) 0.001 (value of a) divided by 4, also with 4-bits resolution), c) 0.01 (value of b) rounded to 3 bits).

Analogous with the preceding observations we now have as an error: F=(1−⅝)=⅜. If 0.011 (+⅜) is selected as the output value, there is a value of F=(0−⅜)=−⅜ for the error according to the same scheme of [I]. According to the invention, we now have: F=(0−⅜)=−⅜.

The order of the means indicated above and also to be indicated below is not to be understood in such a way that they are also to be activated in this order in time.

A further embodiment of the invention comprises means for adapting the block floating point format of the k–1 prediction coefficients already recomputed and not yet recomputed, and means for continuing the recomputation of the k–1 prediction coefficients for the prediction coefficient at which the overflow has occurred.

If overflow occurs during the recomputation of the prediction coefficients, according to [I] only the floating point format of the previously computed prediction coefficients is adapted and then the recomputation is started again from the beginning. In contrast, the embodiment according to the invention avoids a not inconsiderable part of the computation circuitry, especially in the event of a large number of coefficients.

BRIEF DESCRIPTION OF THE DRAWINGS

The invention, and thereof, will be explained with reference to the drawing, in which.

DESCRIPTION OF THE PREFERRED EMBODIMENTS

Figure 1:
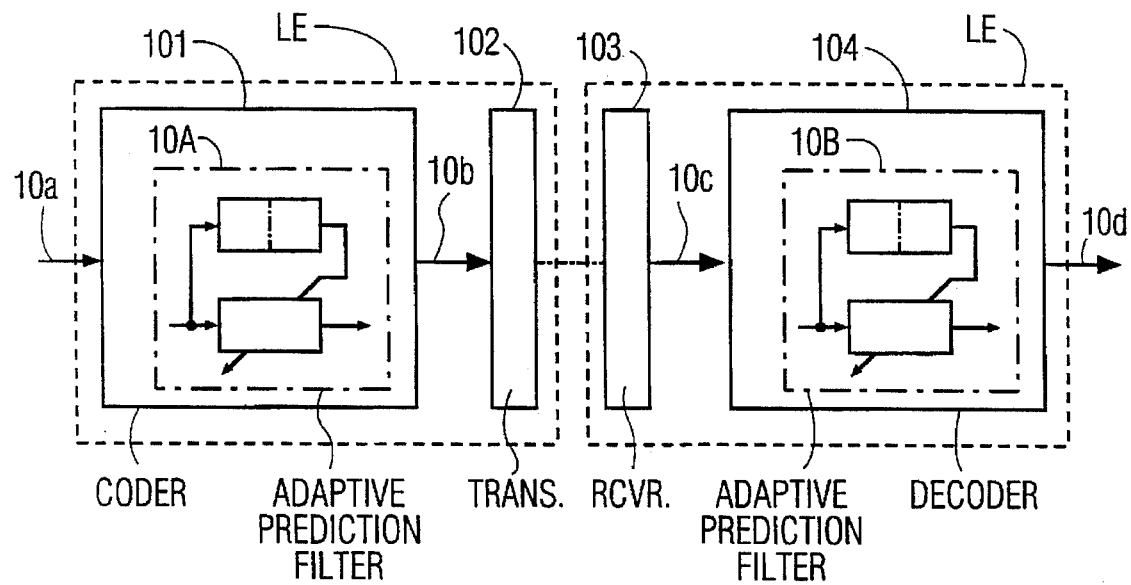
FIG. 1 shows a specific transmission system in which the invention can be used.

FIG. 1 gives a diagrammatic representation of a transmission system comprising a coder 101 and a transmitter 102 on a transmitting side and a receiver 103 and a decoder 104 on a receiving side. The combination of the coder 101 with the transmitter 102 and/or the combination of the receiver 103 with the decoder 104 forms a terminal unit LE.

The coder 101 codes a digitally sampled speech signal 10a by means of an adaptive prediction filter 10A. This filter has characteristic features according to the invention, which will become apparent in the following. The speech signal 10a has a bit rate of 64 kbit/s. The coder 101 reduces this bit rate to the bit rate of the coded signal 10b. The bit rate of the coded signal 10b is 16 kbit/s. The signal 10b consists of parameters of the speech signal 10a, which parameters are determined segment by segment.

The transmitter 102 transmits the coded signal 10b—transcoded into a transmission code, as required—via a transmission channel shown in the drawing to the receiver 103 which transcodes the transmitted signal into a signal 10c and which signal corresponds to the signal 10b except for coding and transmission errors.

The decoder 104 decodes the signal 10c also with the aid of an adaptive prediction filter 10B. The result is a signal 10d. Except for coding, decoding and transmission errors the signal 10d corresponds to the speech signal 10a. The adaptive prediction filters 10A and 10B determine signal-dependent filter coefficients (prediction coefficients) according to the Levinson-Durbin Recursion. The Levinson-Durbin Recursion is an algorithm for determining in a step-by-step fashion the solutions of a linear set of equations of which the coefficient matrix is a Töplitz matrix, thus a symmetrical matrix having the same elements along a given diagonal.

The NCOF prediction coefficients (NCOF stands for the number of these coefficients) for an adaptive prediction filter are unequivocally a consequence of the requirement that the sum of the prediction error squares be minimized on average over a signal section of a given length.

For example, if speech signal sampling values s(k) are applied to the input of the filter, the following linear combination will be the output value of the filter at the instant n:

$$y(n) = \sum_{i=1}^{NCOF} a(i) * s(n-i) \quad (1)$$

The value y(n) is considered the predicted sampling value s(n). If the sum of the error squares is formed i.e.

$$\sum_{i=0}^{LSEG-1} [y(n+i) + s(n+i)]^2 \quad (2)$$

of a segment comprising LSEG sampling values, if (1) is put in in (2) while the coefficients a(i) are minimized in (2), above set of equations with the Töplitz matrix will arise if the sampling values outside this segment are set to zero. The elements of the Töplitz matrix are in this case the values of the autocorrelation function of the input signal at the sampling instants of the input signal, which function will be referenced autocorrelation coefficient r(minc) hereinafter. A detailed representation of the Levinson-Durbin Recursion is found in: L. R. Rabiner/R. W. Schafer, "Digital Pocessing of Speech Signals", Prentice-Hall, 1978.

In the following the algorithm of the Levinson-Durbin Recursion expressed in Rabiner/Schafer by the equations (8.67) to (8.72), is represented as a pseudo code because this code permits a better detection of the program steps an arithmetic unit is to carry out for the computation of the prediction coefficients.

| LEVINSON-DURBIN Recursion (Pseudo code): | |
|---|---|
| Input values: NCOF | = Predictor Coefficient |
| r(0) ... r(NCOF) | = Autocorrelation coefficients |
| Output values: a(0) ... a(NCOF) | = Prediction coefficients |
| a(0) = 1.0 | O1 |
| a(1) = − r(1)/r(0) | O2 |
| alpha = r(0) + r(1) * a(1) | O3 |
| For minc=2,3,4, ... , NCOF | O4 |
| { sum = 0 | O5 |
|    for ip=0,1,2,3, ... , minc−1 | O6 |
|      sum = sum + r(minc−ip) * a(ip) | O7 |
| | O8 |
|    rc =− sum/alpha | O9 |
|    alpha = alpha + sum * rc | O10 |
| | O11 |
|    if(alpha <= 0.0) break | O12 |
| | O13 |
|    For ip=1,2,3, ... ,minc/2 | O14   { R1 = a( ip) + rc *a(minc−ip)) |
| | O15 |
|      R2 = a(minc−ip) + rc * a( ip)) | O16 |
|      a(ip ) = R1 | O17 |
|      a(minc−ip) = R2 | O18 |
|    } | O19 |
|    a(minc) = rc | O20 |
| } | O21 |

To render the program steps given in the pseudo code even more transparent, several rows of the algorithm shown above will be further explained.

The predictor coefficient carrying the name of NCOF and the NCOF+1 autocorrelation coefficients are required as input data. The predictor coefficient NCOF is identical with the number of filter coefficients a(i) in equation (1). The autocorrelation coefficients r(0), r(1) and so on, up to r(NCOF) are determined by other functional units not disclosed here, which, however, are known to a person skilled in the art.

The prediction coefficients a(0), a(1) and so on, up to a(NCOF) are output data.

Rows 01 and 02 comprise assignments to the two first prediction coefficients. In row 03 there is an assignment to an auxiliary variable alpha (prediction error for NCOF=1)

whose augend is the zero$^{th}$ autocorrelation coefficient and whose addend is the product of the first correlation coefficient and the first prediction coefficient.

If the predictor coefficient NCOF is equal to 1, the computation is over, otherwise a loop having a running variable minc is passed through, which variable assumes all integers from 2 to NCOF. In the loop for the running variable minc all the previously computed prediction coefficients a(1), a(2) and so on, up to a(minc-1) are changed (recomputed), as is shown in rows 017 and 018. At the end of all the instructions which are to be carried out for the current value k of the running variable minc, a value is assigned to the prediction coefficient having the index minc, as is shown in row 020. This prediction coefficient is to be referenced the k$^{th}$ prediction coefficient; the variables sum and rc (reflection coefficient) which are computed for the first time for the current value k of the running variable minc are to obtain the same addition.

In the loop having the running variable minc two further loops are passed through which are not interleaved and have the running variable ip, the upper value of which variable depends on the current value of the running variable minc, as is shown in rows 06 and 014.

Auxiliary variables are those carrying the names of alpha, sum, rc, R1 and R2. The auxiliary variable alpha is the sum of the error squares according to equation (2), and also has a descriptive meaning; alpha is the energy content of the error signal (prediction error). This content is always to be positive. The computation is therefore broken off if there is a value for alpha smaller than or equal to zero, as is shown in row 012. Also the variable rc has a descriptive meaning; it is the so-termed reflection coefficient which plays a part in the so-called tube model of the vocal tract. A reflection coefficient which occurs as a quotient of the auxiliary variables sum and alpha, as is shown in row 09, belongs to each prediction coefficient.

Most real-time implementations of speech coding methods according to which also coefficients for adaptive filters are to be computed, are based on 16-bit fixed-point arithmetic units, while intermediate results are available partly with enhanced accuracy (for example, 32 bits). The accuracy of the result of the Levinson Recursion decisively depends on the computational accuracy in the recursion. As regards computational accuracy the most sensitive positions in the pseudo code are found where intermediate results of multiplication or division are available with higher resolution and are then to be reduced to the simple resolution. They are especially the rows 02, 03, 07, 09, 010, 015, 016 and 020.

A module for realising the Levinson-Durbin Recursion in 16-bit fixed-point arithmetic, will be described with reference to the following pseudo code. Several definitions are to be introduced first:
>> Right shift operation;
<< Left shift operation;
round (reg) Rounding operation performed on a 32-bit-wide
    register "reg". Let us assume that the bits in "reg" are numbered 0, 1, 2, ..., 31, while the sign
bit is bit 31 and the significance of the individual bits decreases from bit
30 towards bit 0. Rounding with an accuracy of 16 bits then means that bit 15 is added to bit 16 after which the bits 16 to 31 are used as the result.
*2* Fixed-point multiplication;
Fixed-point division;

Since the division is very costly to carry out, the result of the division is computed accurate to only as many positions as are absolutely necessary. Results of the divisions are flush right in the register containing the results.

$x_h$ means the 16 most significant bits of a 32-bits word x.
$x_l$ means the 16 least significant bits of a 32-bits word x.

16-Bits fixed-point Levinson Recursion (Pseudo code):

```
EXPa = 0;                                              X1
den = r[0];                                            X2
num = r[1];                                            X3
if (num < 0) num = -num;                               X4
a2 = num/den;                                          X5
a2 = a2<<15;                                           X6
a1 = round(a2);                                        X7
if (r[1] > 0) a1 = -a1;                                X8
rc1 = a1h;                                             X9
a[1] = a1h;                                            X10
a0l = 0;                                               X11
a0h = r[0];                                            X12
a0 = a0 + rc1 *2* r[1];                                X13
a0 = round(a0);                                        X14
alpha = a0h;                                           X15
for (minc=2; minc<=NCOF; minc++)                       X16
{ a0 = 0;                                              X17
    for (ip=1; ip < minc; ip++)                        X18
        a0 = a0 + r[minc-ip] *2* a[ip]                 X19
                                                       X20
    a0 = a0<<EXPa;                                     X21
    a1l = 0;                                           X22
    a1 = r[minc];                                      X23
    a0 = a0 + a1;                                      X24
    a0 = round(a0);                                    X25
    sign = a0h;                                        X26
    num = a0h;                                         X27
    if (num < 0) num = -num;                           X28
    if (num >= alpha)                                  X29
        goto LEDUMO_failed;                            X30
    a2 = num/alpha;                                    X31
    a2 = a2<<15;                                       X32
    a1 = round(a2);                                    X33
    if (a0 > 0) a1 = -a1;                              X34
    rc = a1h;                                          X35
                                                       X36
    a1l = 0;                                           X37
    a1h = alpha;                                       X38
    a1 = a1 + rc *2* a0h;                              X39
    a1 = round(a1);                                    X40
    if (alpha <= 0)                                    X41
        goto LEDUMO_failed;                            X42
    alpha = a1h;                                       X43
                                                       X44
    a0 = 0;                                            X45
    a1 = 0;                                            X46
    for (ip=1; ip <= (minc>>1); ip++)                  X47
    { a0h = a[ip];                                     X48
        a0 = a0 + rc *2* a[minc-ip];                   X49
        a0 = round(a0);                                X50
        If (overflow in a0)                            X51
        { EXPa = EXPa + 1;                             X52
            for (lp=1; lp<minc; lp++)                  X53
                a[lp] = a[lp]>>1;                      X54
            a0h = a[ip];                               X55
            a0 = a0 + rc *2* a[minc-ip];               X56
            a0 = round(a0);                            X57
        }                                              X58
        a1h = a[minc-ip];                              X59
        a1 = a1 + rc *2* a[ip];                        X60
        a1 = round(a1);                                X61
        If (overflow in a1)                            X62
        { EXPa = EXPa + 1;                             X63
            for (lp=1; lp<minc; lp++)                  X64
                a[lp] = a[lp]>>1;                      X65
            a0h = a[ip];                               X66
            a0 = a0 + rc *2* a[minc-ip];               X67
            a0 = round(a0);                            X68
            a1h = a[minc-ip];                          X69
            a1 = a1 + rc *2* a[ip];                    X70
            a1 = round(a1);                            X71
        }                                              X72
        a[ip]= a0h;                                    X73
        a[minc-ip] = a1h;                              X74
}                                                      X75
```

-continued

| 16-Bits fixed-point Levinson Recursion (Pseudo code): | |
|---|---|
| a2 = a2>>EXPa; | X76 |
| a2 = round(a2); | X77 |
| if (sign > 0) a2 = −a2; | X78 |
| a[minc] = a2h; | X79 |
| } | X80 |
| a[0] = EXPa; | X81 |
| return; | X82 |
|  | X83 |
| LEDUMO_failed: | X84 |
| a[0]= −1; | X85 |
| return; | X86 |

Explanations of the pseudo code:

In fixed-point representation the prediction coefficients a[i] can only assume values between −1.0 and +1.0. Since, however, the coefficients a[i] can exceed 1.0 (rows X47 .. . X75) during the recursion, all the coefficients are represented in the block floating-point format. This is to say, all the coefficients are normalized to a common basis $2^{EXPa}$, so that the mantissa of all the normalized prediction coefficients lies again between −1.0 and +1.0. At the start of the Levinson Recursion no coefficients have been computed yet, therefore the exponent EXPa is set to 0 (row X1).

Row 01 is not carried out here, because a(0)=1.0 need not additionally be computed.

Rows 02 and 03 are converted similarly in the loop having the running variable minc. Therefore, an explanation of the fixed-point resolution will be given hereinbelow.

First there will be a description of the fixed-point implementation of rows 05 to 07: In rows X17, X19 a0 denotes a 32-bit-wide accumulation register. A multiplication input register is loaded with the autocorrelation coefficient r[minc-ip]. A further multiplication input register is loaded with the mantissa of the previously computed normalized predictor coefficient a[ip]; the associated exponent EXPa is the same for all the coefficients. It should especially be emphasized that the coefficient a[0] is not included in the normalization, because a multiplication by a[0]=1 need not additionally be carded out.

The final result of the accumulation, first without the component a[0]*2*r[minc], is reduced in row X21 from the floating-point representation to the fixed-point representation by a left shift arrangement for denormalizing the 32-bit result in accumulator a0.

In rows X22 to X24 the component a[0]*2*r[minc] is added up while a further 32-bit-wide register a1 is used. There should be noted that the lower part of the register a1 is to be erased, because, owing to its use, the auxiliary register a1 could still contain previous values at other locations.

In rows X25 to X28 the counter term for the division is prepared to compute the current ($k^{th}$) reflection coefficient rc. The division demands positive input data having a 16 bits data width which is achieved in row X25 by a rounding operation of the 32-bit-wide result in a0.

Registers at the input of a divider unit are directly loaded to carry out the division for the computation of the current ($k^{th}$) reflection coefficient rc; an exponent is not necessary. There should be stated here that in [I] the division by floating-point values of alpha and hum, recovered from a0 of row X24, is carded out. This corresponds to a considerable increase of the necessary computing speed.

The result of the division in row X31 is computed with an accuracy of 17 bits, the $17^{th}$ bit being necessary for the rounding operation. This rounding is performed in row X33 to compute the current ($k^{th}$) reflection coefficient and in row X77 to compute the current ($k^{th}$) prediction coefficient. In row X32 the result of the division, of which the 17 bits are stored right-justified in the 32-bit-wide register a2, is appropriately adapted to the fixedly set decimal point before the rounding operation. After the correct sign has been used in row X34, finally the current reflection coefficient rc is derived from the upper part of the 32-bit-wide register a1 by reading the upper 16-bit-wide word a1h.

In rows X37 to X40 the new value of alpha is computed in the manner known henceforth, while all the input and output variables are represented in the 16-bit fixed-point format. Here too special mention is made of the fact that at this position in [I] computations are made with floating-point representation for alpha and a0h (a0h corresponds to sum in row 09), which corresponds to a considerable increase of the required computing speed.

In rows X45 to X74 the previously computed predictor coefficients are adapted (recomputation and adaptation of the block floating-point format). This corresponds to the operations from rows 015 to 018. The special thing about this is that in the case of an overflow during the recomputation of the prediction coefficients a[ip] and a[minc-ip] respectively, all the coefficients (i.e. the coefficients already computed and not yet recomputed, thus those previously computed) coefficients a[1], a[2], ... a[minc-1] are reduced by the factor of ½ (=fight shift by 1 bit in row X54, X65, respectively). No overflow can then take place any longer when there is a recomputation in rows X55, X56, X57 and X66 to X71, respectively.

After the adjustment of the old coefficients (computed previously) has been terminated, the new ($k^{th}$) prediction coefficient a[minc] is computed from rc (see row 020). In the fixed-point format there should be noted that also the new ($k^{th}$) coefficient is to be stored in the block floating-point format. Therefore, the reflection coefficient rc computed above, which is available in the non-normalized fixed-point format, is stored in a[minc] after a fight shift by EXPa bits. With the solution given here, first the reflection coefficient, which is still stored in register a2 and has a 17-bit resolution, is shifted to the right by EXPa bits and subsequently rounded with an accuracy of 16 bits. This is the decisive difference from the solution published in [I] in which the reflection coefficient already rounded directly after the division is shifted to the right by EXPa bits and the new prediction coefficient is derived by clipping to 16 bits. This very difference at this position leads to the 16-bit fixed-point implementation of the Levinson Recursion described here which produces better results with attendant considerably less cost of computation than the solution shown in [I].

Figure 2:
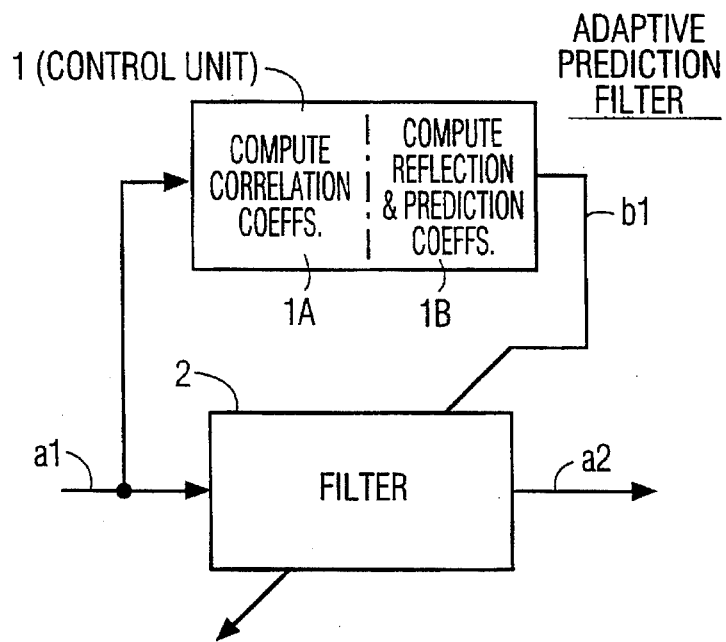
FIG. 2 shows the basic circuit diagram of an adaptive prediction filter.

FIG. 2 shows an adaptive prediction filter. Such prediction filters comprise a digital filter in a narrower sense 2 and a control unit 1. The filter in the narrower sense 2 produces output values y(n) according to equation (1) and sends them over a line a2. Input values s(n) are applied both to the filter in the narrower sense 2 and to the control unit 1 over a line a1.

The control unit 1 may also coarsely be subdivided into two functional units 1A and 1B. The functional unit 1A computes correlation coefficients from a section of the input signal and conveys these values to the functional unit 1B which computes therefrom, pursuant to the expression (2), new prediction coefficients in accordance with the program steps described above. The control unit 1 then substitutes over a line b1 the whole block of new prediction coefficients computed by unit 1B for the prediction coefficients used so far. The described filter comprising the functional unit 1B can be used several times in modern speech codecs.

Figure 3:
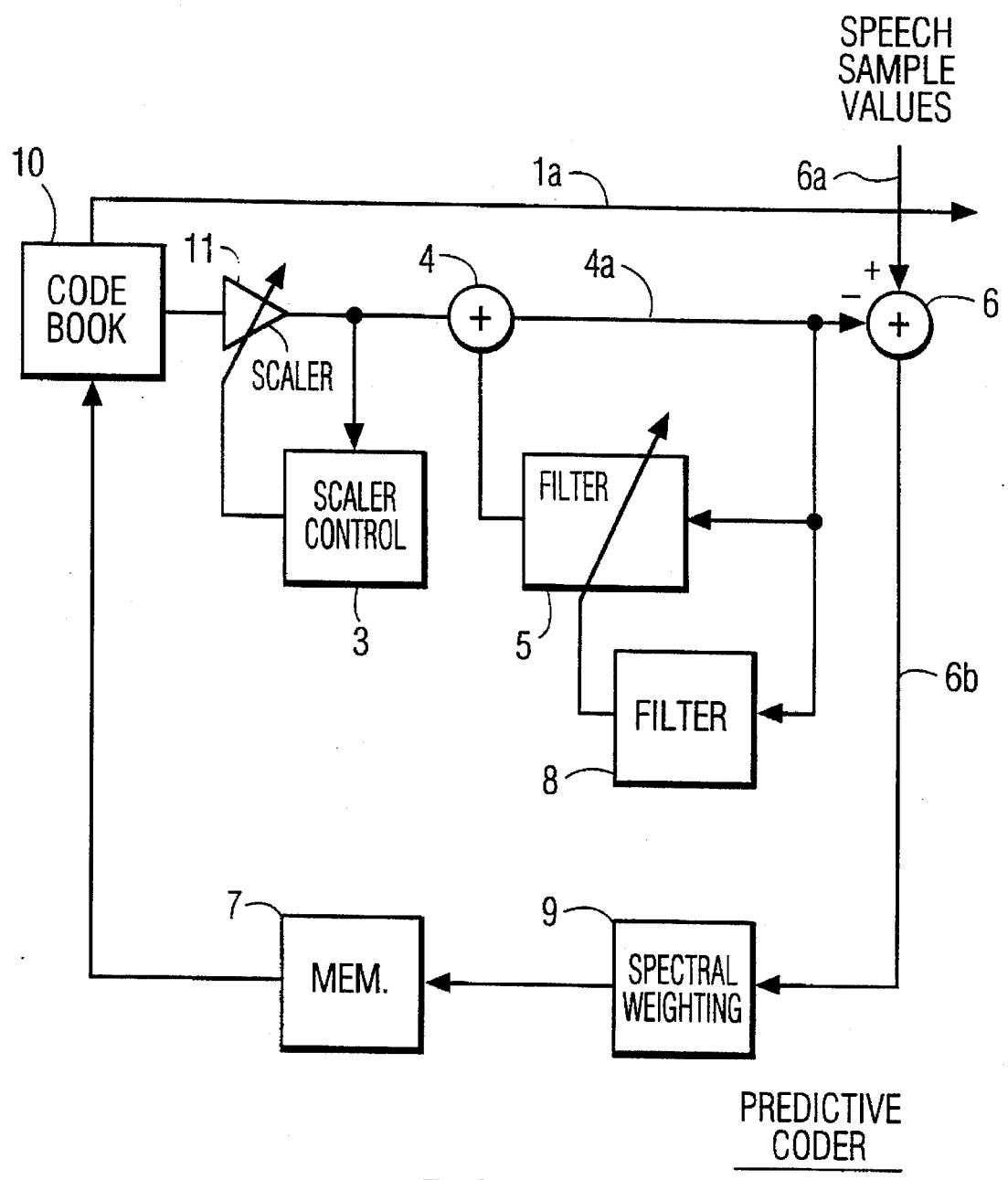
FIG. 3 shows the basic circuit diagram of a speech coder.

FIG. 3 shows a predictive speech coder by which the coded speech signal is also decoded to improve the coding. Therefore, a special description of a decoder is omitted.

The speech signal to be coded is applied in the form of sampling values to the coder via a line 6a. A subtracter 6 subtracts therefrom the appropriate values of the speech signal again decoded by the coder, which speech signal is applied to the subtracter 6 over a line 4a. Over a line 6b the difference is sent to a unit 9 which makes a spectral weighting of the difference signal (for an extensive description see, for example, CHEN, J. H.: HIGH-QUALITY 16 KB/s SPEECH CODING WITH A ONE-WAY DELAY LESS THAN 2 MS. 1990, IEEE S9.1, pp. 453 to 456), after which for a speech signal segment the sum of the error squares is formed and stored in memory 7. For a segment of the speech signal on line 6a, 128 different coding options are tested and, finally, the option bringing about the fewest errors is sent to the receiver as a code signal.

These 128 options arise from the fact that a code book referenced 10 stores 128 so-called vectors. Each vector is a sequence of sampling values, which sequence contains a simulation of the signal, by which the vocal tract of a human being can be excited, for example, for resonance. The vectors are read consecutively from code book 10 and scaled by a controllable scaler 11 (this corresponds to the volume control when human speech is generated). The scaler 11 is controlled via a unit 3. Subsequently, the scaled vectors are fed to a predictor 4, 5 and 8 having backward prediction. The predictor forms a copy of the operation of the human vocal tract. It comprises a filter 5 and a filter 8 as shown in FIG. 2. Such filters are furthermore included in the units 3 and 9. Via a line 1a is transmitted, for example, the number of the vector that has led to the fewest errors in the current speech signal segment.

Figure 4A:
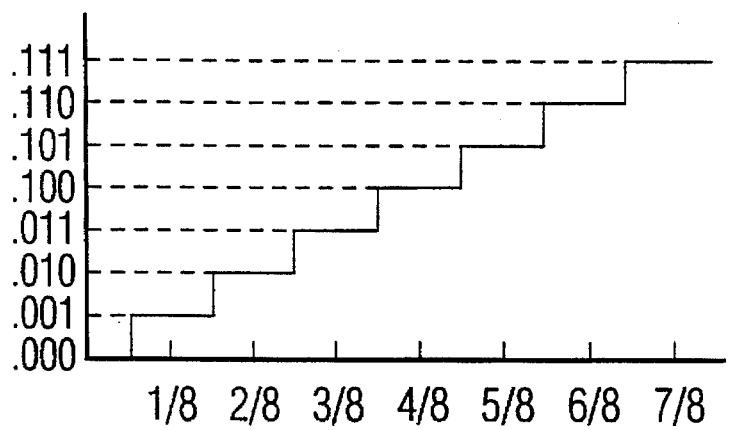
FIG. 4 (a), (b) and (c) are diagrams for clarifying a difference in coding error between the invention and the state of the art.

The diagrams of FIG. 4 (a), (b) and (c) graphically show what has been demonstrated hereinbefore with respect to two examples, that is to say, that with the conversion of prediction coefficients in a block floating point format with mantissas to 3 bits, the invention on average produces better results than according to the state of the art (I). Output data are all the positive binary numbers with 4-bits resolution. To facilitate the verification comparison of the two lower diagrams, the upper diagram FIG. 4(a) shows an assignment of the output data in binary representation (the sign bit is omitted) as against their representation in fractions.

Figure 4B:
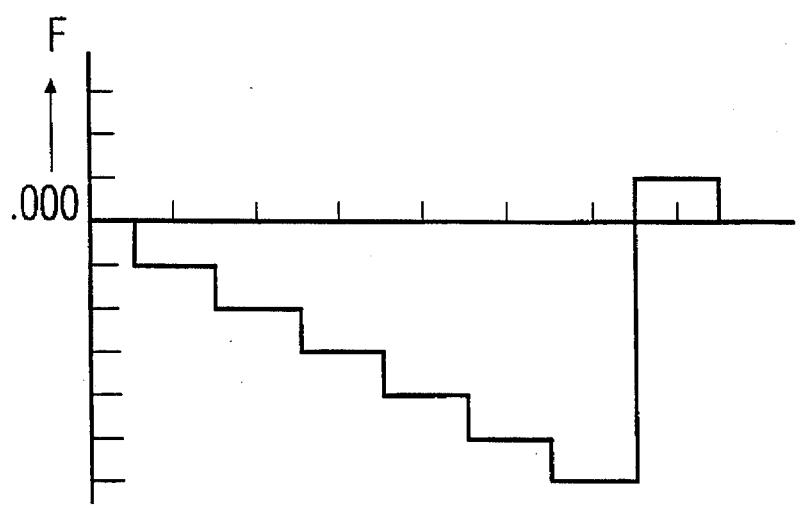
Figure 4C:
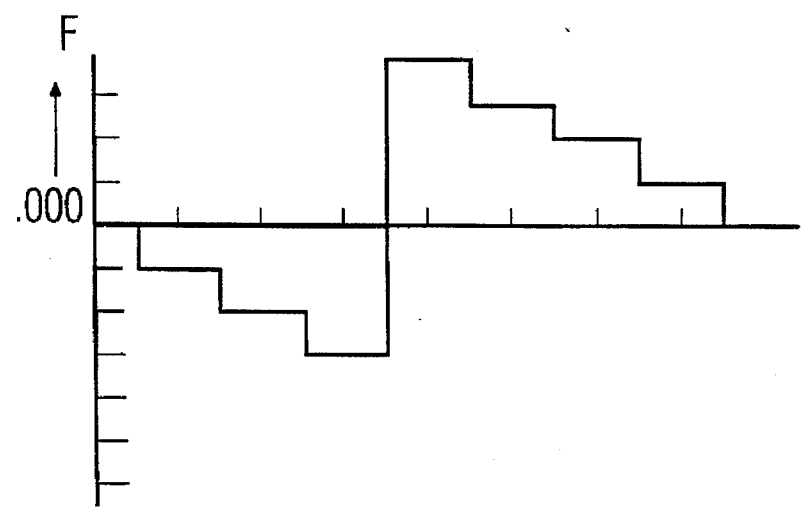

The middle diagram FIG. 4(b) shows the error F which is made if the output data are first rounded according to [I] and then the mantissas are computed with 3-bits resolution. The lower diagram FIG. 4(c) shows the error F which is made if the mantissas are first computed with 4-bits resolution and then rounded to 3 bits. The scale for the error F is the same in either case and corresponds to that of the upper diagram FIG. 4(a).

I claim:

1. A coder for encoding a sampled audio signal, said coder including an adaptive prediction filter which comprises:

first processing means for computing correlation coefficients from the sample values of segments of the sampled audio signal;

second processing means for computing reflection coefficients and prediction coefficients from said correlation coefficients in N-bit fixed point arithmetic; and third processing means which, in cooperation with said second processing means, provides recursive recalculation of the prediction coefficients in block floating point format by the steps of:

(a) computing a $k^{th}$ reflection coefficient with a minimum resolution of N+1 bits;

(b) buffering the $k^{th}$ reflection coefficient computed in step (a);

(c) determining the $k^{th}$ reflection coefficient with a resolution of N bits;

(d) recomputing the k–1 previously computed prediction coefficients based on the $k^{th}$ reflection coefficient determined in step (c);

(e) adapting the block floating point format of the k–1 prediction coefficients if overflow occurs during recomputation thereof, so that N bits are no longer sufficient to represent a recomputed prediction coefficient;

(f) converting the $k^{th}$ reflection coefficient buffered in step (b) to a floating point format number whose exponent is that of the block floating point format employed in step (e) and whose mantissa has a resolution of at least N+1 bits;

(g) rounding to N bits the mantissa of the converted $k^{th}$ reflection coefficient obtained in step (f); and (h) storing the $k^{th}$ reflection coefficient obtained in step (g) as the $k^{th}$ prediction coefficient.

2. A coder as claimed in claim 1 wherein, in the event overflow occurs as specified in step (e), further comprising adapting the block floating point format of the k–1 prediction coefficients already computed and not yet recomputed, and continuing re-computation of those of the k–1 prediction coefficients commencing at the prediction coefficient at which overflow occurred.

3. A decoder for decoding an encoded sampled audio signal, said decoder including an adaptive prediction filter which comprises:

first processing means for computing correlation coefficients from the sample values of segments of the sampled audio signal;

second processing means for computing reflection coefficients and prediction coefficients from said correlation coefficients in N-bit fixed point arithmetic; and third processing means which, in cooperation with said second processing means, provides recursive recalculation of the prediction coefficients in block floating point format by the steps of:

(a) computing a $k^{th}$ reflection coefficient with a minimum resolution of N+1 bits;

(b) buffering the $k^{th}$ reflection coefficient computed in step (a);

(c) determining the $k^{th}$ reflection coefficient with a resolution of N bits;

(d) recomputing the k–1 previously computed prediction coefficients based on the $k^{th}$ reflection coefficient determined in step (c);

(e) adapting the block floating point format of the k–1 prediction coefficients if overflow occurs during recomputation thereof, so that N bits are no longer sufficient to represent a recompute prediction coefficient;

(f) converting the $k^{th}$ reflection coefficient buffered in step (b) to a floating point format number whose exponent is that of the block floating point format employed in step (e) and whose mantissa has a resolution of at least N+1 bits;

(g) rounding to N bits the mantissa of the converted $k^{th}$ reflection coefficient obtained in step (f); and (h) storing the $k^{th}$ reflection coefficient obtained in step (g) as the $k^{th}$ prediction coefficient.

4. A decoder as claimed in claim 3 wherein, in the event overflow occurs as specified in step (e), further comprising adapting the block floating point format of the k–1 prediction coefficients already computed and not yet re-computed, and continuing re-computation of those of the k−1 prediction coefficients commencing at the prediction coefficient at which overflow has occurred.

5. An adaptive prediction filter for a sampled audio signal, said filter comprising:

first processing means for computing correlation coefficients from the sample values of segments of the sampled audio signal;

second processing means for determining reflection coefficients and prediction coefficients from said correlation coefficients in N-bit fixed point arithmetic; and third processing means which, in cooperation with said second processing means, provides recursive recalculation of the prediction coefficients in block floating point format by the steps of:

(a) computing a $k^{th}$ reflection coefficient with a minimum resolution of N+1 bits;

(b) buffering the $k^{th}$ reflection coefficient computed in step (a);

(c) determining the $k^{th}$ reflection coefficient with a resolution of N bits;

(d) recomputing the k−1 previously computed prediction coefficients based on the $k^{th}$ reflection coefficient determined in step (c);

(e) adapting the block floating point format of the k−1 prediction coefficients if overflow occurs during re-computation thereof, so that N bits are no longer sufficient to represent a re-computed prediction coefficient;

(f) converting the $k^{th}$ reflection coefficient buffered in step (b) to a floating point format number whose exponent is that of the block floating point format employed in step (e) and whose mantissa has a resolution of at least N+1 bits;

(g) rounding to N bits the mantissa of the converted $k^{th}$ reflection coefficient obtained in step (f); and h) storing the $k^{th}$ reflection coefficient obtained in step (g) as the $k^{th}$ prediction coefficient.

6. An adaptive prediction filter as claimed in claim 5, wherein, in the event overflow occurs as specified in step (e), further comprising adapting the block floating point format of the k−1 prediction coefficients already computed and not yet re-computed, and continuing re-computation of those of the k−1 prediction coefficients commencing at the prediction coefficient at which overflow occurred.

* * * * *